(12) United States Patent
Pham

(10) Patent No.: US 12,328,823 B2
(45) Date of Patent: Jun. 10, 2025

(54) AUTOMATED MEMORY CARD PRESS FIXTURE

(71) Applicant: Tuong Vinh Ngoc Pham, San Jose, CA (US)

(72) Inventor: Tuong Vinh Ngoc Pham, San Jose, CA (US)

( * ) Notice: Subject to any disclaimer, the term of this patent is extended or adjusted under 35 U.S.C. 154(b) by 287 days.

(21) Appl. No.: 18/108,594

(22) Filed: Feb. 11, 2023

(65) Prior Publication Data
US 2024/0276693 A1    Aug. 15, 2024

(51) Int. Cl.
*B23P 19/00* (2006.01)
*H05K 13/00* (2006.01)
*H05K 13/04* (2006.01)
*H05K 13/08* (2006.01)
*H05K 1/18* (2006.01)

(52) U.S. Cl.
CPC ..... *H05K 13/0406* (2018.08); *H05K 13/0015* (2013.01); *H05K 13/0069* (2013.01); *H05K 13/0812* (2018.08); *H05K 13/0882* (2018.08); *H05K 13/0888* (2018.08); *H05K 1/182* (2013.01); *H05K 2201/10159* (2013.01)

(58) Field of Classification Search
CPC .......... H05K 13/0015; H05K 13/0069; H05K 13/04; H05K 13/0406; H05K 13/0812; H05K 13/0882; H05K 13/0888; H05K 3/301; H05K 2203/0165; H05K 2203/0278; H05K 2203/167; H05K 1/182; H05K 2201/10159; H05K 2201/10325; G06F 1/182; G06F 1/183
See application file for complete search history.

(56) References Cited

U.S. PATENT DOCUMENTS

| 2007/0165380 | A1* | 7/2007 | Lai ...................... H01L 23/4093 361/695 |
| 2020/0052435 | A1* | 2/2020 | Shaw ................... H01R 12/737 |
| 2022/0077609 | A1* | 3/2022 | Singh ..................... H05K 1/142 |

* cited by examiner

*Primary Examiner* — Paul D Kim
(74) *Attorney, Agent, or Firm* — PatentPC; Bao Tran

(57) ABSTRACT

A fixture system for installing one or more memory modules onto a motherboard includes a fixture base with a load cell sensor, a stage with a presser for pressing the one or more memory modules into place, a processor or a programmable logic controller (PLC) to control control the stage, a Human Machine Interface (HMI) for monitoring and controlling the pressing force applied to the DIMMs during installation, and two hand buttons for activating the fixture.

11 Claims, 8 Drawing Sheets

AUTOMATED MEMORY CARD PRESS FIXTURE

BACKGROUND

In computer assembly, the components are assembled onto a motherboard. Typically memory cards such as DIMMs are inserted into the motherboard.

Inserting DIMM (dual in-line memory module) cards into a motherboard can be a delicate process, and care should be taken to avoid damaging the memory modules or the motherboard itself. There are several precautions an assembler can take to minimize the risk of damage:

Make sure the computer is turned off and unplugged before attempting to install the DIMM.

Handle the DIMM by the edges or the metal retention clips, and avoid touching the electrical contacts or the memory chips.

Locate the correct memory slot on the motherboard and align the notches on the DIMM with the keyed socket to ensure proper orientation.

Gently insert the DIMM into the socket, applying even pressure to both sides of the module until the retention clips snap into place.

Double-check the DIMM to make sure it is securely seated in the socket and the retention clips are engaged.

Improper assembly of the DIMM cards with the motherboards can run the risk of damaging the motherboard and/or the memory cards.

SUMMARY OF THE INVENTION

In one aspect, a fixture system for installing one or more memory modules onto a motherboard includes a fixture base with a load cell sensor, a stage with a presser for pressing the one or more memory modules into place, a processor or a programmable logic controller (PLC) to control the stage, a Human Machine Interface (HMI) for monitoring and controlling the pressing force applied to the DIMMs during installation, and two hand buttons for activating the fixture.

In another aspect, a method of installing one or more memory modules onto a motherboard includes one or more of the following operations:
a. loading a motherboard onto a fixture base,
b. loading one or more memory enclosures onto the motherboard,
c. loading one or more memory modules onto the enclosures,
d. activating the fixture using two hand buttons,
e. controlling a Z-axis actuator to move a presser to the memory module position,
f. monitoring and controlling the pressing force applied to the one or more memory modules during installation,
g. moving the Z-axis actuator back to the initial position after installation is complete, and
h. removing the installed one or more memory modules and motherboard from the fixture.

Implementations of the above aspects may include one or more of the following. The method includes the step of controlling a processor or a programmable logic controller (PLC) to coordinate the operation of the fixture components. The method includes monitoring and displaying the pressing force on a Human Machine Interface (HMI). The method includes setting a pressing force setpoint on the HMI. The method includes receiving operation commands from two hands. The memory modules comprise Dual In-line Memory Modules (DIMMs). The method includes detecting position of the memory modules with a laser beam. The method includes detecting alignment of the memory modules with a laser beam. The method includes disabling operation of the motherboard if one of the memory modules are improperly inserted into the motherboard. The Z-axis actuator comprises an electrical motor, an air cylinder or a pneumatic cylinder.

Advantages of the system may include one or more of the following:

Automation: The fixture system is fully automated, reducing the risk of human error and providing a consistent and efficient installation process.

Safety: The use of a 2-hand controller and an emergency stop button provides a high level of safety during the installation process. This helps to ensure that the operator is in a safe position in case of an emergency and that the installation process can be stopped quickly if necessary.

Control: The use of a PLC provides a centralized means of controlling the various components of the fixture, ensuring that the installation process is performed correctly and efficiently.

Force control: The ability to monitor and control the amount of force being applied during the installation process helps to reduce the risk of damage to the DIMMs and the motherboard.

Versatility: The adjustable height of the optional table and the ability to move the machine with casters provides versatility and allows the fixture to be used in a variety of different manufacturing environments.

Robust design: The sturdy construction of the table and the high-quality components used in the fixture ensure that the system is robust and reliable, reducing the risk of downtime and maintenance requirements.

Efficient installation: The automated and controlled installation process ensures that the DIMMs are securely installed in the shortest amount of time, increasing the overall efficiency of the manufacturing process. The system ensures that the DIMM is properly installed and functioning.

Automating the DIMM installation process using the fixture system can significantly reduce labor costs compared to manual installation methods. Automated systems are typically more efficient and consistent than manual processes, which can help to reduce the amount of time required for each installation. Additionally, the reduced risk of human error during the installation process can help to minimize the number of rejected or faulty components, which can also contribute to reduced labor costs. By reducing the amount of time and resources required for installation, the use of the fixture system can help to lower overall labor costs for the manufacturing process.

BRIEF DESCRIPTION OF THE DRAWINGS

Turning now descriptively to the drawings, in which similar reference characters denote similar elements throughout the several views, the figures illustrate the electronic book of the present invention. With regard to the reference numerals used, the following numbering is used throughout the various drawing figures.

DESCRIPTION

The following discussion describes in detail one embodiment of the invention (and several variations of that embodiment). This discussion should not be construed, however, as limiting the invention to those particular embodiments, practitioners skilled in the art will recognize numerous other embodiments as well. For definition of the complete scope of the invention, the reader is directed to appended claims.

Figure 1A:
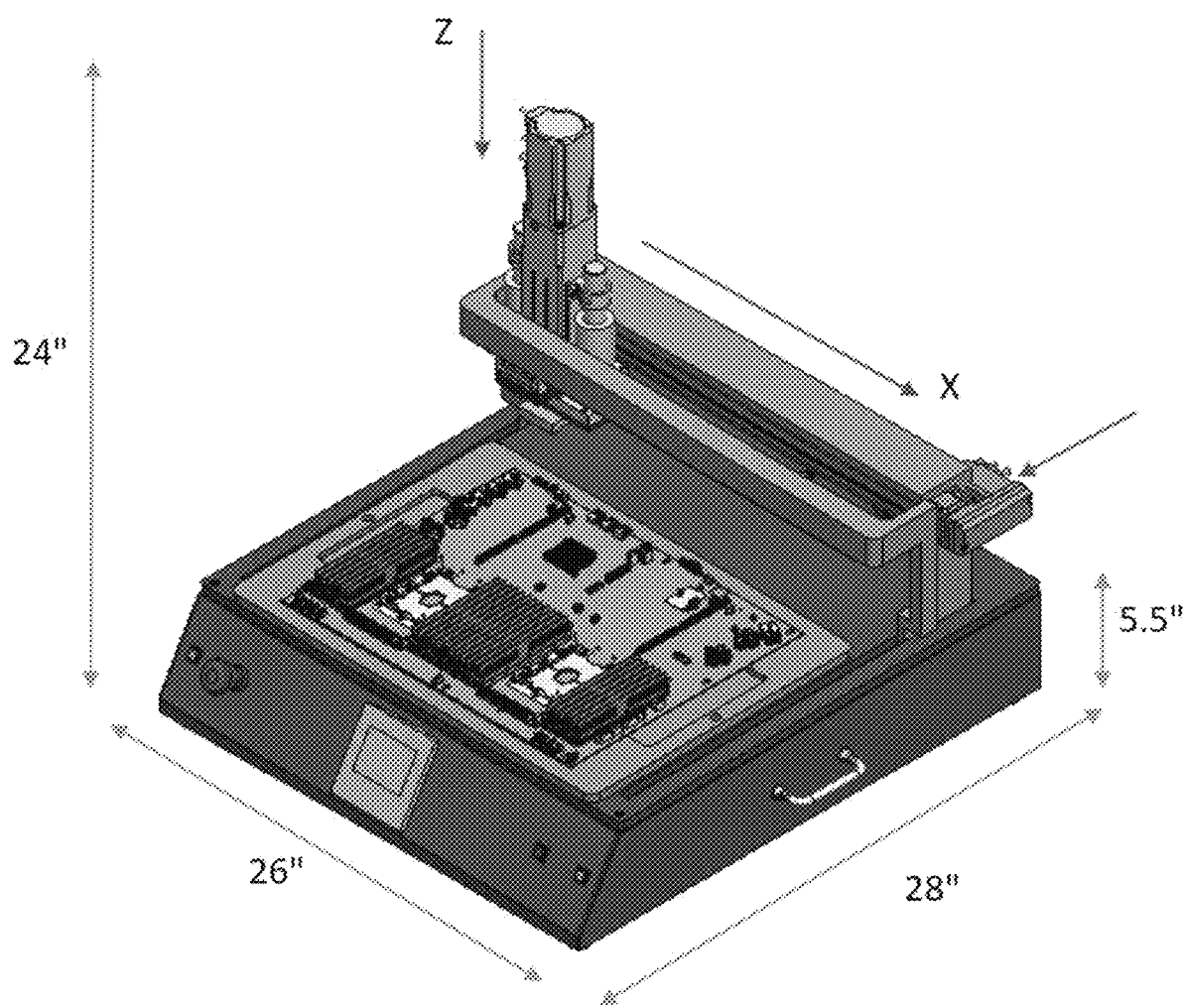
FIGS. 1A-1B shows a semi-automated card press fixture used to securely position and hold a motherboard in place while it is being installed or tested.
Figure 1B:
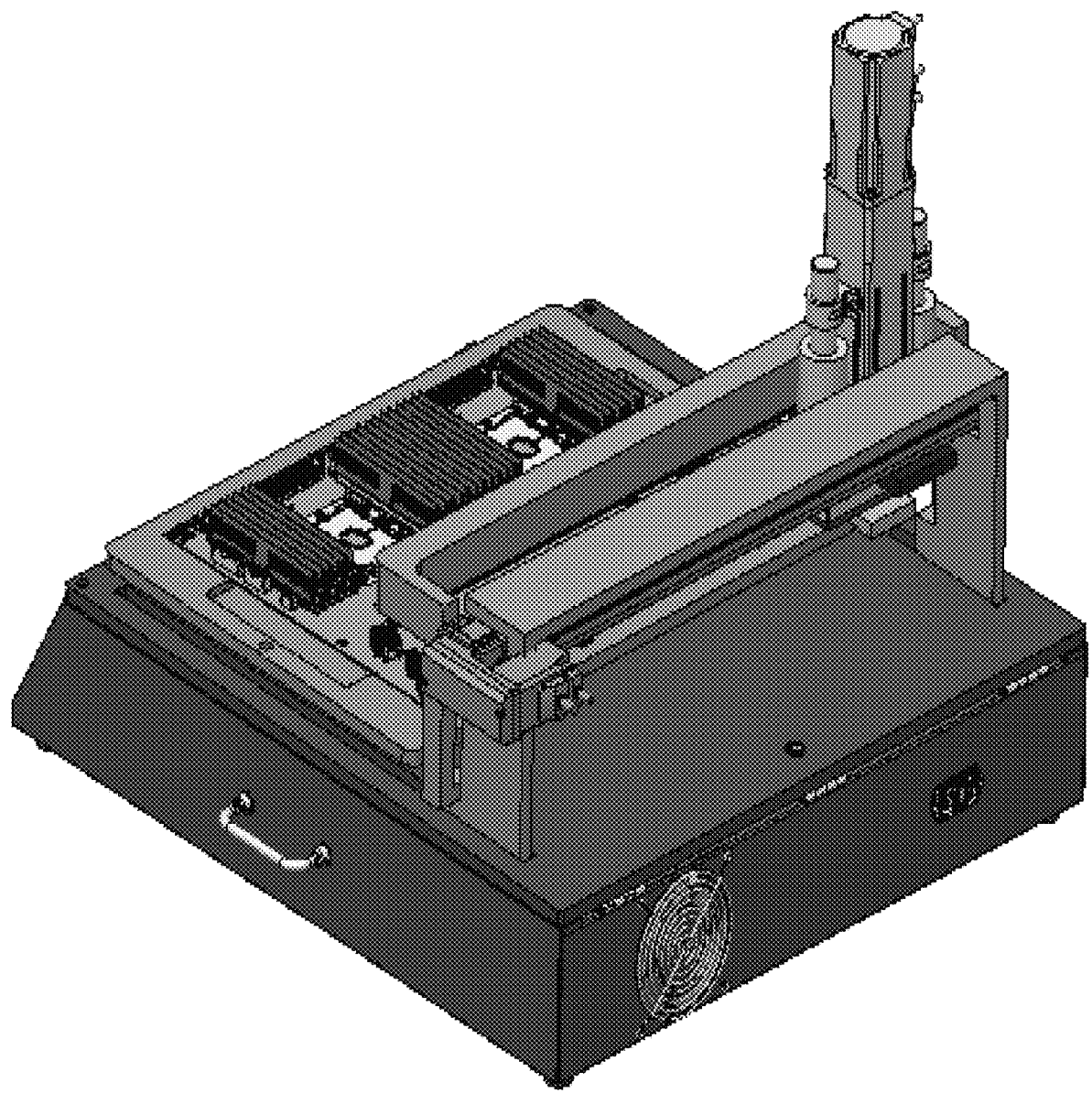

FIGS. 1A-1B shows a semi-automated card press fixture used to securely position and hold a motherboard in place while it is being installed or tested. A PLC (programmable logic controller) controls one or more linear motors that actuate the X, Y, and Z axis traveling, allowing the operator to precisely position the motherboard.

In addition to the green buttons used to initiate the machine operation, there are also two other important buttons on the fixture. The first button is the emergency button, which is used to quickly disconnect power in the event of an emergency or unexpected situation. This button is designed to be easily accessible and can be used to quickly shut down the machine in case of a problem. The second button is the stop button, which is used to stop the program in order to perform maintenance or make adjustments. This button allows the operator to pause the machine operation at any time, making it easier to perform routine maintenance or troubleshoot issues.

By having these two buttons available, the fixture can provide greater control and flexibility during the installation process, allowing for easy adjustments and maintenance as needed.

In one implementation, the fixture has a maximum capable motherboard size of 20"×15", and the operator loads the motherboard onto the base and starts the operation by pressing two green buttons with both hands. The load cell sensor measures the pressing force applied to the motherboard and displays the value on the HMI (human-machine interface), allowing the operator to monitor and adjust the force as needed.

This type of fixture can help to ensure consistent and precise positioning of the motherboard, reducing the risk of damage or misalignment during the installation process.

Figure 2:
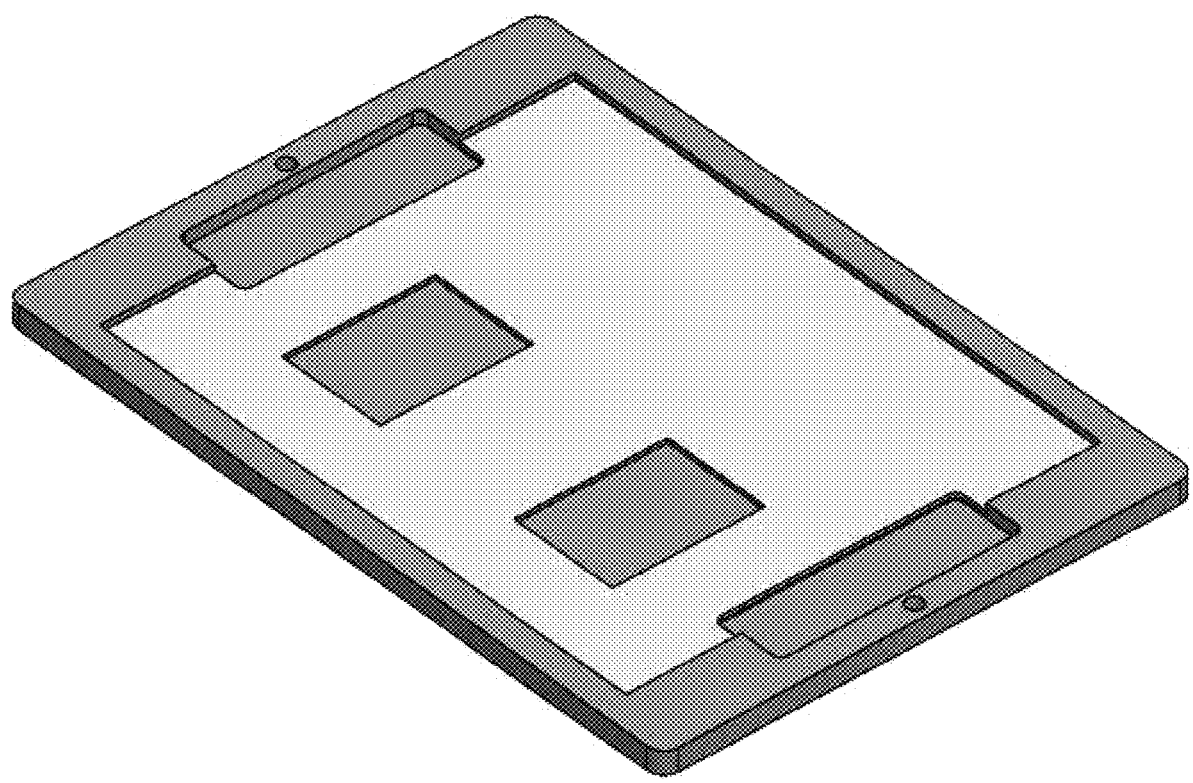
FIG. 2 shows an exemplary Transition Base to support a motherboard (MB).

FIG. 2 shows an exemplary Transition Base to support a motherboard (MB). In one embodiment, the Transition Base is removable and made of ESD plastic. In another embodiment, the Transition Base includes an ESD (electrostatic discharge) foam to support components during the transition process. The foam provides a cushioned surface to protect the components from damage during handling and transportation. Each group of motherboards will come with a unique Base and Foam. This suggests that different types of motherboards may have different requirements for support and protection, and that the Transition Base and Foam are customized to meet those needs. The use of a Transition Base with ESD foam or plastic can help to ensure the safe and secure handling of sensitive components during the transition process, reducing the risk of damage and increasing the efficiency of the overall operation.

To operate the fixture, an operator would first turn on the power button. Then, using the HMI, the operator would select the appropriate program for the group of motherboards they are working with. For example, if the operator is installing DIMMs for motherboard group A, he or she would select program "Group A" from the HMI.

The machine would then load the program for motherboard group A and the program would be locked and operable by a designated engineer. This helps to ensure that the correct procedures are followed and that only authorized personnel can operate the fixture. By using a programmable HMI and locking the programs, the system can improve the safety, efficiency, and consistency of the motherboard installation process.

To load the motherboard onto the machine, the operator would first place the Transition Base onto the fixture, aligning it with the two guide pins for quick and accurate positioning. The guide pins help to ensure that the Base is properly aligned and securely in place on the machine.

Once the Base is in place, the operator would then load the motherboard onto the fixture, carefully aligning it with the Base and ensuring that it is securely in place. The use of guide pins and a cushioned Transition Base with ESD foam can help to ensure accurate positioning and protect the components during the loading process.

After the motherboard has been securely loaded onto the fixture, the operator would then proceed to load all of the DIMM (dual in-line memory module) enclosures onto the motherboard. This involves carefully aligning the enclosures with the socket on the motherboard and ensuring that they are securely in place.

Next, the operator would then load all of the DIMMs into the enclosures. This involves carefully aligning the notches on the DIMMs with the keyed sockets in the enclosures and ensuring that the DIMMs are securely seated in the sockets.

By following these steps, the operator can ensure that all of the DIMMs are properly installed and functioning and that the motherboard is ready for further testing or installation.

By following these steps, the operator can efficiently and safely load the motherboard onto the fixture and prepare it for installation or testing.

Figure 3:
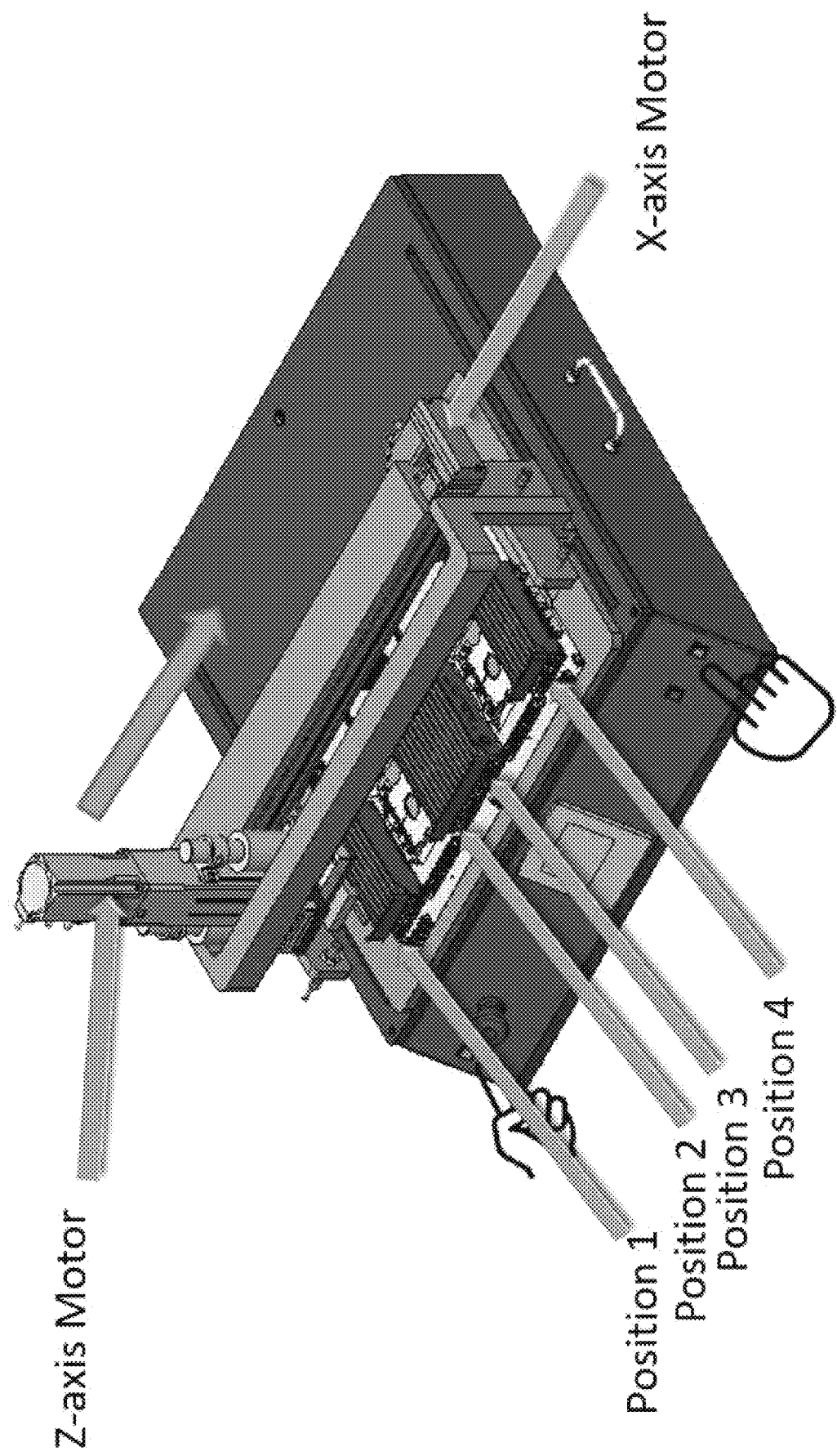
FIG. 3 shows an exemplary operation of the system.

FIG. 3 shows an exemplary operation of the system. After the DIMMs have been installed onto the motherboard using DIMM enclosures, the operator would use both hands to press two green buttons to initiate the machine operation. This allows the fixture to control the movement of the Crossing Bar Assembly to the proper position.

DIMM (Dual In-line Memory Module) enclosures are protective covers or casings that are used to hold DIMM memory modules for installation on a motherboard. The DIMM enclosures typically have a form factor that is compatible with the DIMM slot on the motherboard and are used to protect the memory modules from physical damage, dust, and other environmental factors. The enclosure surrounds the DIMMs to ensure the modules are properly positioned on the board. The DIMMs are lined up inside the enclosure. Once the DIMMs are inserted into the sockets, the enclosure is removed. The enclosure has positioning pins or legs to ensure proper placement of the enclosure. One embodiment can hold up to 12 DIMMs and prevent module movement.

DIMM enclosures are typically made from plastic or metal and come in a variety of shapes and sizes depending on the type of DIMM memory module that they are designed to hold. In some embodiments, the enclosures have a number of different features such as snap-on lids, locking mechanisms, and ejector levers that are used to securely hold the memory module in place and to make it easy to install and remove the module.

The enclosures are used to protect the memory modules during installation and to ensure that they are securely seated in the correct position on the motherboard. The machine operates by pressing the DIMMs into the correct position in the DIMM enclosures, which are then installed onto the motherboard. The enclosures are an important component in the installation of DIMM memory modules onto a motherboard and play an important role in ensuring that the memory modules are protected and correctly installed.

The machine will then use two photoelectric sensors to check whether the DIMMs are in the correct position and not rocking. If the sensors detect that the DIMMs are rocking, the machine will alarm, and the operator will need to release the two buttons. The Crossing Bar Assembly will then be controlled to return to its initial position, allowing the operator to adjust the DIMMs as needed.

By using photoelectric sensors and a safety mechanism to prevent rocking, the fixture can ensure that the DIMMs are properly installed and functioning. If the DIMMs are not in the correct position, the operator can adjust before continuing with the installation or testing process.

If the DIMMs are in the correct position and not rocking, the machine will proceed with the installation process. The X-axis motor will actuate to bring the Z-axis motor to the position of the first DIMM. The Z-axis motor will then actuate the Presser to press down on the DIMM, applying a set pressing force.

The machine will repeat this process for each of the remaining DIMM positions, moving the Z-axis motor to each position and actuating the Presser to secure the DIMM in place. Once all of the DIMMs have been properly installed, the Z-axis motor will actuate the Presser back to its initial position.

Finally, the X-axis motor and the Y-axis motor inside the chassis will actuate back to their initial positions, and the operator can release the green buttons.

By using linear motors and a presser to securely install the DIMMs, the fixture can ensure that the installation process is efficient, accurate, and consistent. The use of a programmable HMI and safety mechanisms can help to improve the safety and reliability of the installation process.

Once the installation process is complete, the operator would then remove the DIMM enclosure from the machine. This involves carefully lifting the enclosure off of the motherboard and setting it aside.

Next, the operator would remove the motherboard from the fixture. This would typically involve carefully lifting the motherboard off of the base and setting it aside.

Once the DIMM enclosure and motherboard have been removed, the operator can then start the next cycle. This might involve loading a new motherboard onto the fixture, installing new DIMMs, or performing other tasks as needed.

By having a clear and organized process for removing the DIMM enclosure and motherboard, the operator can ensure that the installation process is efficient and consistent, helping to improve overall productivity.

Figure 4A:
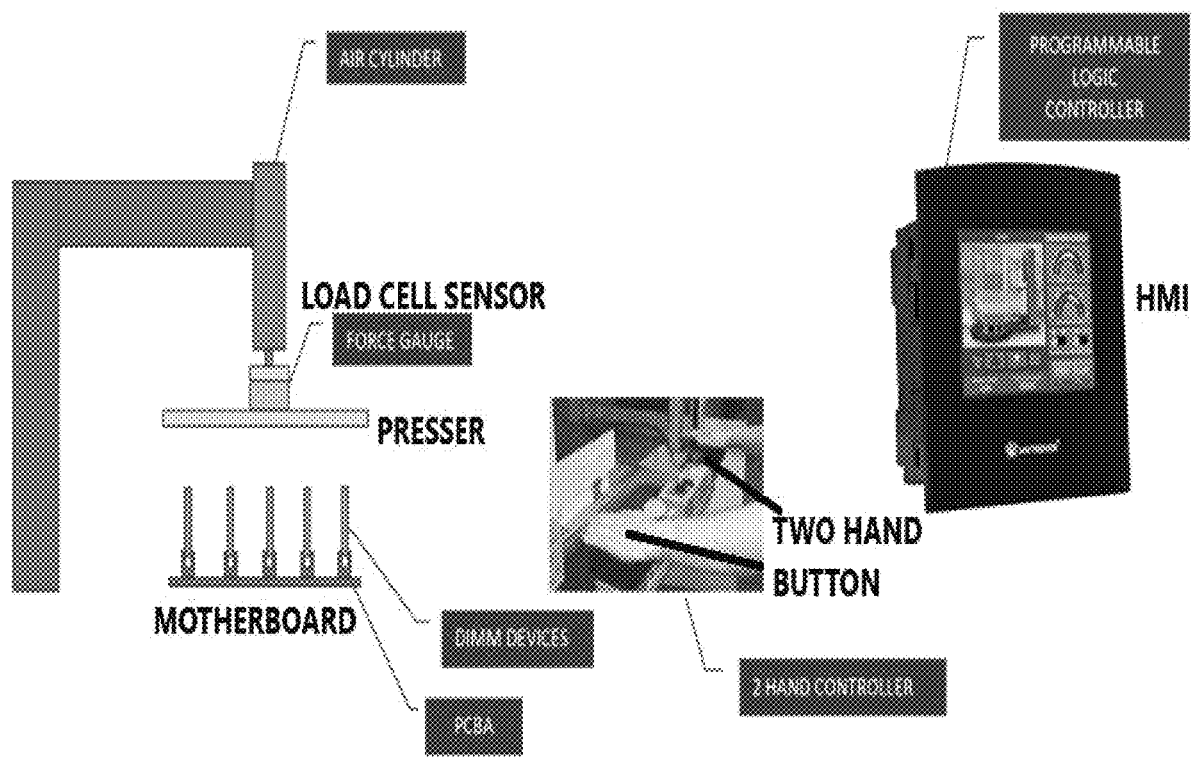
FIGS. 4A-4B show another embodiment of an automated DIMM card press fixture.
Figure 4B:
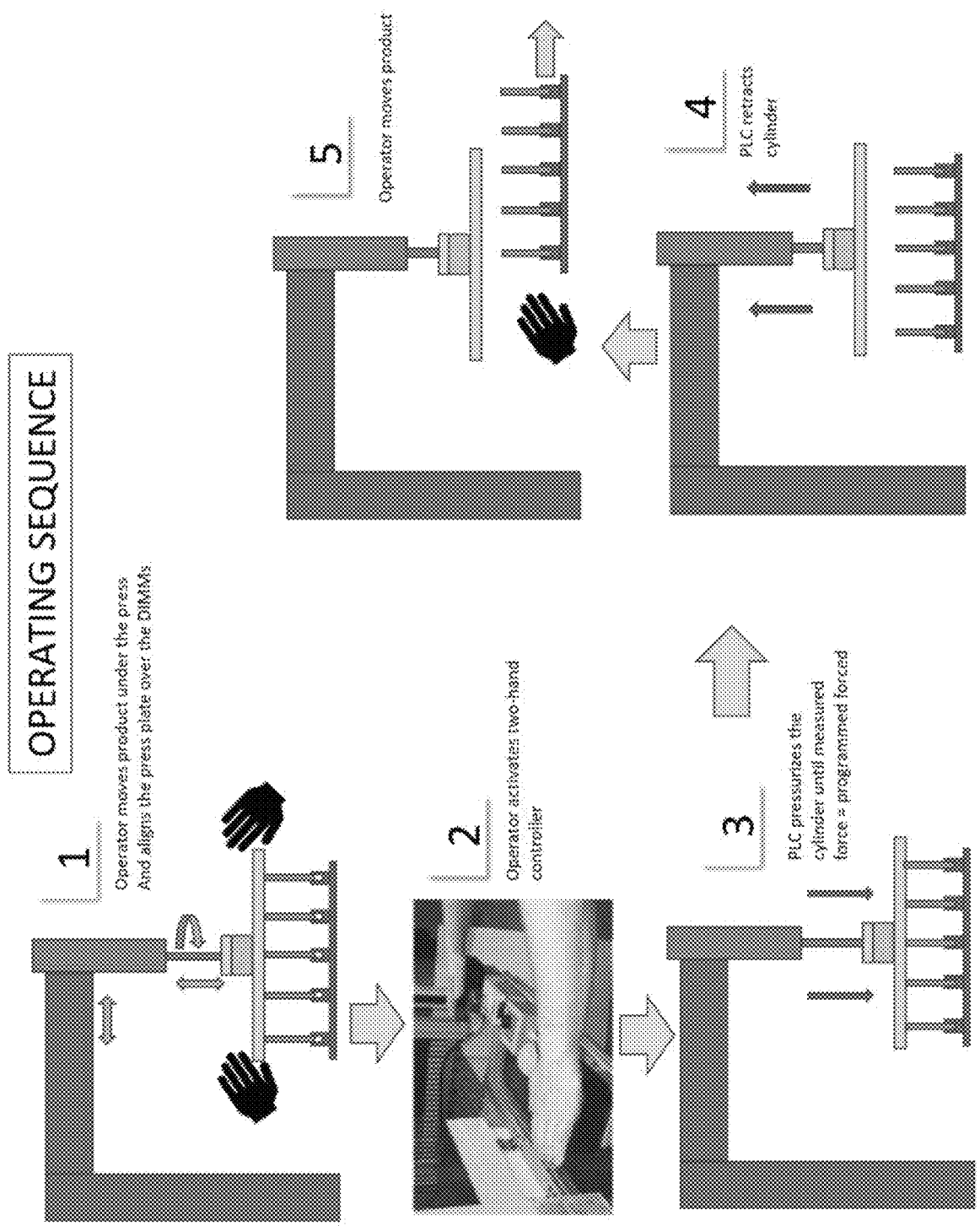

FIGS. 4A-4B show another embodiment of an automated DIMM card press fixture. The fixture for installing DIMMs on a motherboard is controlled by a Programmable Logic Controller (PLC). The PLC provides a centralized and automated means of controlling the various components of the fixture, including the linear motors, press cylinder, and emergency stop button.

The 2-hand controller is used to initiate the installation process and to activate the emergency stop in case of an emergency. By requiring the use of two hands, the 2-hand controller helps to ensure that the operator is paying attention to the installation process and that they are in a safe position in case of an emergency.

The press cylinder is used to apply force to the DIMMs to ensure that they are securely installed on the motherboard. The PLC controls the operation of the press cylinder, ensuring that the correct amount of force is applied at the correct time.

The press force display and control allow the operator to monitor and adjust the amount of force being applied by the press cylinder. This is important to ensure that the DIMMs are securely installed and that they are not damaged in the process.

The press force setpoint can be set up using the HMI. This is a preset number with a tolerance adjustment to allow the operator to fine-tu the desired amount of force that should be applied during the installation process. This can be adjusted based on the specific requirements of the DIMMs and the motherboard, providing a more efficient and effective installation process.

Figure 5:
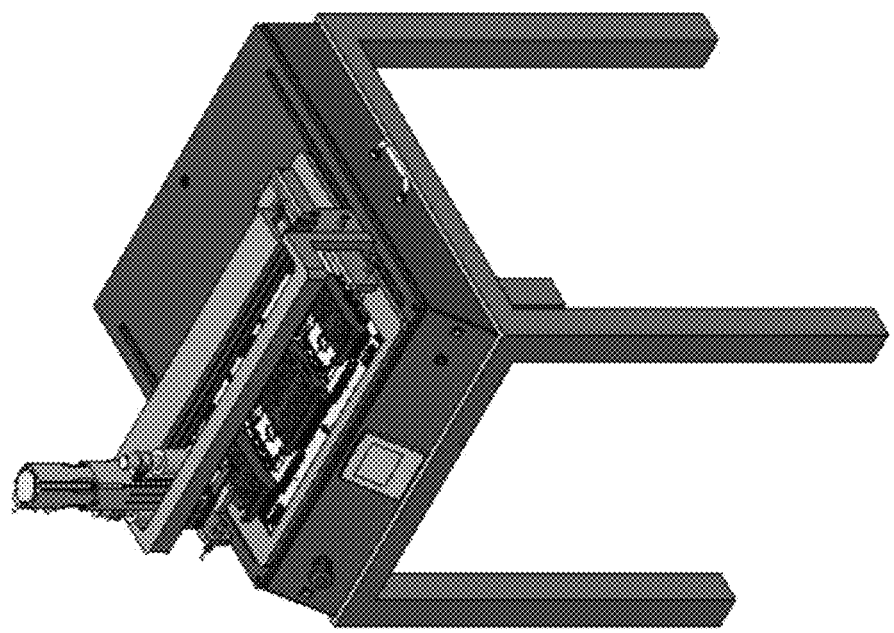
FIG. 5 shows an optional table for the machine.
Figure 5:
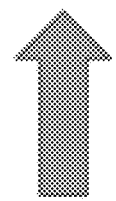
Figure 5:
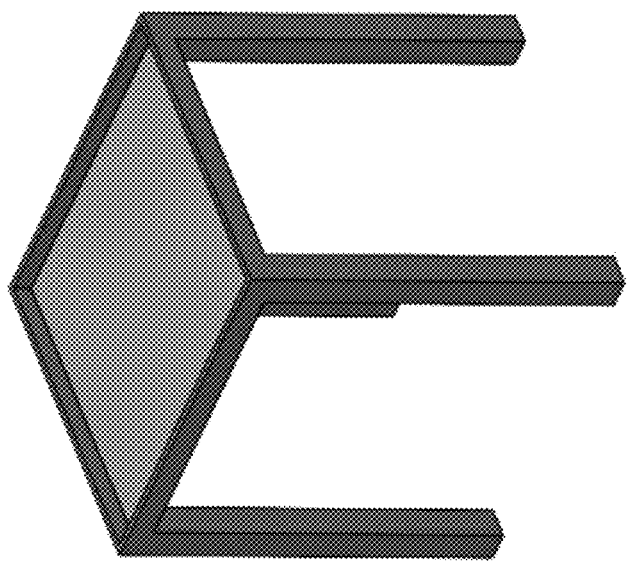

FIG. 5 shows an optional table for the machine. The optional table can be added to the fixture to provide additional support and stability during the installation process. The table can be designed to accommodate the machine and its components, providing a stable and secure platform for the fixture to operate on.

The table can be designed with an adjustable height feature, allowing the operator to set the table to a comfortable height for the installation process. This can help to reduce fatigue and improve overall efficiency.

In addition, the table can be equipped with casters, making it easy to move the machine from one location to another. This can be particularly useful in situations where the machine needs to be relocated for maintenance or repair, or to accommodate changes in the manufacturing process.

The table can be constructed from sturdy materials, such as steel or aluminum, to provide a stable platform for the fixture and its components. By having a robust and stable table, the fixture can operate more efficiently, reducing the risk of damage to the motherboard or DIMMs during the installation process.

Figure 6:
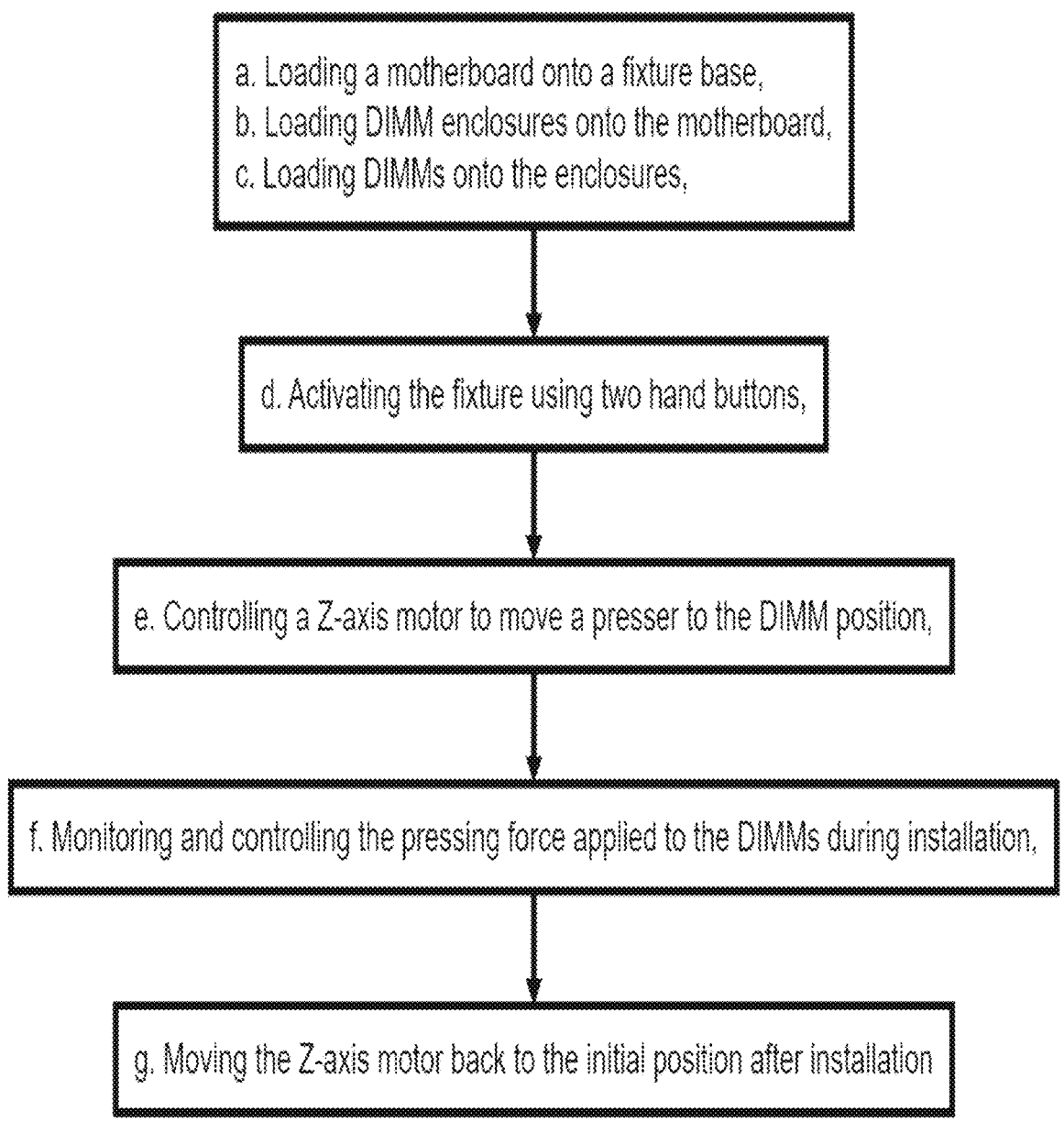
FIG. 6 shows an exemplary method of installing one or more memory modules onto a motherboard.

FIG. 6 shows an exemplary method of installing one or more memory modules onto a motherboard. The method includes:

a. loading a motherboard onto a fixture base,
b. loading one or more memory enclosures onto the motherboard,
c. loading one or more memory modules onto the enclosures,
d. activating the fixture using two hand buttons,
e. controlling a Z-axis actuator to move a presser to the memory module position,
f. monitoring and controlling the pressing force applied to one or more memory modules during installation,
g. moving the Z-axis actuator back to the initial position after installation is complete, and
h. removing the completed assembly with the installed one or more memory modules and the motherboard from the fixture.

There are several alternative implementations of the system described in the previous statements:

Alternative Actuation Methods: Instead of linear motors, other actuation methods such as hydraulic cylinders, pneumatic cylinders or servo motors can be used to control the X, Y and Z axis.

Alternative Control System: Instead of using a PLC, the system can be controlled by a microcontroller, programmable logic controller (PLC), or a computer-based control system.

Alternative User Interface: Instead of using an HMI, the user interface can be implemented using a touch screen, a computer screen, or a physical control panel.

Alternative Force Measurement: Instead of using a load cell sensor to measure pressing force, other force measurements techniques such as strain gauges or piezoelectric sensors can be used.

Alternative Emergency Stop: Instead of a physical emergency stop button, an emergency stop function can be implemented using software or by disconnecting power to the system.

These are just a few examples of alternative implementations of the system described. The specific implementation will depend on the requirements of the system, the intended use, and the design constraints.

While there has been shown several alternate embodiments of the present invention, it is to be understood that certain changes can be made as would be known to one skilled in the art without departing from the underlying scope of the invention as is discussed and set forth above and below. Furthermore, the embodiments described above are only intended to illustrate the principles of the present invention and are not intended to limit the scope of the invention to the disclosed elements.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects. The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, the inventive subject matter may lie in less than all features of a single disclosed embodiment. Thus, the following claims are hereby incorporated into the Detailed Description, with each claim standing on its own as a separate embodiment.

What is claimed is:

1. A fixture system for installing one or more memory modules onto a motherboard, comprising:
    a. a fixture base with a load cell sensor;
    b. a stage with a presser for inserting the one or more memory modules into the motherboard;
    c. a processor or a programmable logic controller (PLC) to control the stage;
    d. A Human Machine Interface (HMI) for monitoring and controlling the pressing force applied to Dual In-line Memory Modules (DIMMs) during installation; and
    e. two hand buttons for activating the fixture base.

2. The fixture system according to claim 1, further comprising an emergency stop button for quickly stopping inserting the one or more memory modules into the motherboard in case of emergency.

3. The fixture system according to claim 1, further comprising linear motors for controlling X, Y, and Z axis traveling of the fixture base.

4. The fixture system according to claim 1, further comprising a table to support the motherboard and components.

5. The fixture system according to claim 1, wherein the HMI inputs a pressing force setpoint.

6. The fixture system according to claim 1, further comprising a code for receiving operation commands from two hands.

7. The fixture system according to claim 1, wherein the memory modules comprise Dual In-line Memory Modules (DIMMs).

8. The fixture system according to claim 1, further comprising a code for detecting position of the one or more memory modules with a light beam or a laser beam.

9. The fixture system according to claim 1, further comprising a code for detecting alignment of the one or more memory modules with a light beam or a laser beam.

10. The fixture system according to claim 1, further comprising a code for disabling operation of the motherboard if one of the one or more memory modules are improperly inserted into the motherboard.

11. The fixture system according to claim 1, wherein the stage comprises an electrical motor, an air cylinder or a pneumatic cylinder.

* * * * *